(12) United States Patent
Baechtle et al.

(10) Patent No.: US 6,518,517 B2
(45) Date of Patent: Feb. 11, 2003

(54) CIRCUIT BOARD HAVING A THROUGH HOLE HAVING AN INSULATING MATERIAL INSIDE AND A CONDUCTIVE ELEMENT

(75) Inventors: Jeffrey C. Baechtle, Vestal, NY (US); Stephen R. Howland, Vestal, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/788,809

(22) Filed: Feb. 20, 2001

(65) Prior Publication Data

US 2002/0112883 A1 Aug. 22, 2002

(51) Int. Cl.7 .................................................. H05K 1/11
(52) U.S. Cl. ........................ 174/266; 174/251; 361/773; 361/761
(58) Field of Search .................................. 174/262, 263, 174/264, 265, 266, 251; 361/792, 793, 794, 795, 773, 761, 762, 763, 764

(56) References Cited

U.S. PATENT DOCUMENTS 5,050,295 A * 9/1991 Sullivan et al. ............. 174/266
5,180,440 A * 1/1993 Siegel et al. ................ 136/200
5,257,452 A   11/1993 Imai et al. ...................... 29/846
5,290,970 A    3/1994 Currie .......................... 174/250
5,331,514 A *  7/1994 Kuroda ......................... 174/255
5,363,280 A * 11/1994 Chobot et al. ............... 174/266
5,538,433 A *  7/1996 Arisaka ........................ 174/266
5,809,641 A    9/1998 Crudo et al. ................... 29/840
5,890,284 A *  4/1999 Chartrand et al. ........... 174/263
6,108,866 A    2/2000 Crudo et al. ................... 29/740

OTHER PUBLICATIONS

IBM Technical Disclosure Bulletin, "Defective Hole Repair", vol. 22, No. 1, Jun. 1979, pp. 67–68.
IBM Technical Disclosure Bulletin, "Solder Ball Connection Engineering Change/Wire Add Rework Concepts", vol. 36, No. 12, Dec. 1993, pp. 133–136.

* cited by examiner

Primary Examiner—Albert W. Paladini
Assistant Examiner—Jose H Alcaia
(74) Attorney, Agent, or Firm—Connolly Bove Lodge & Hutz; Lawrence R. Fraley

(57) ABSTRACT

Electrical nets are prepared by bonding an electrically conductive element in a deleted plated via. The electrically conductive element has a headed portion that contacts the bottom of the laminate and the other end of the electrically conductive element electrically connects to a BGA pad or surface trace line.

9 Claims, 1 Drawing Sheet

CIRCUIT BOARD HAVING A THROUGH HOLE HAVING AN INSULATING MATERIAL INSIDE AND A CONDUCTIVE ELEMENT

TECHNICAL FIELD

The present invention relates to a structure and method for replacing electrical nets (point to point connections within a circuit board). More particularly, the present invention relates to a structure and method capable of replacing electrical nets in two sided component surface mount carriers as well as single sided board assemblies. The present invention can be employed on traditional "dogbone" BGA sites as well as the newer denser BGA patterns where traces extend in different patterns from the pad to the via.

BACKGROUND OF INVENTION

Electrical components are commonly mounted on circuit panel structures such as circuit boards. Circuit panels ordinarily include a generally flat sheet of a dielectric material with electrical conductors disposed on a major, flat surface of the panel or on both major surfaces. The conductors are commonly formed from metallic materials such as copper and serve to interconnect the electrical components mounted to the board. Where the conductors are disposed on both major surfaces of the panel, the panel may have additional conductors extending through the dielectric layer so as to interconnect the conductors on opposite surfaces. Multilayer circuit board assemblies have been made heretofore which incorporate plural, stacked circuit boards with additional layers of dielectric materials separating the conductors on mutually facing surfaces of adjacent boards in the stack. These multi-layer assemblies ordinarily incorporate interconnections extending between the conductors on the various circuit boards in the stack as necessary to provide the required electrical interconnections.

Point to point electrical connections within the circuit board are commonly referred to as nets. However, due to current manufacturing and process limitations in the construction of high layer count, thick, large and correspondingly expensive printed circuit boards, there is a significant yield impact due to defective nets (i.e. nets that are open or shorted).

The present practice to improve the yield in the manufacture of these types of boards has been to delete the defective nets from the board and replace them with discrete wires running on the surface. The discrete wiring is typically added after assembly of the components to the board during the assembly process. The repair of a net that is terminated at a ball grid array (BGA) site presents a hurdle to the repair wiring process in that the interconnect to the device is not readily accessible.

The problem of repair for single sided surface mount technology (SMT) boards is addressed in U.S. Pat. Nos. 5,809,641 and 6,018,866. This method, however, suffers from limitations of use for single sided SMT assemblies with BGA's that have dogbone connections immediately adjacent to the deleted via. A unique pin is required for varying board thickness and the protrusion of the pin on the bottom side precludes the ability to screen solder paste on the bottom side and thus two sided assembly.

With respect to two sided SMT assemblies with BGA's located at the end of a defective net, repair has been carried out on the BGA side of the board by running a fine gauge wire (34 ga magnet wire) from BGA pad to BGA pad after having left the affected BGAs off during the initial SMT assembly. The wires were soldered to the BGA pads and glued down along the topside board surface to hold the wire in place during subsequent BGA attachment using a BGA rework tool. The disadvantage of this method was the need to leave off the BGAs during initial assembly and the need to run the fine wire between the BGA pads to escape from the array. This wire was exposed during the rework process to damage and shorting to adjacent BGA interconnects (balls).

In order to reduce the chance of damaging the wire or shorting the adjacent BGA balls, the above method has been modified wherein a fine gauge wire is fed up through the drilled out via. The insulation is stripped from the end of the wire, the end is flattened and soldered to the BGA pad that is associated with the deleted net, an epoxy is then added around and into the via to maintain the wire in place and over and around the wire near the BGA pad to provide a solder dam. This modified method provides improvement over prior practice but still requires that the BGAs be left off during the initial assembly.

Having to leave the BGAs off during initial assembly is a quality and logistics detractor in the assembly of two sided SMT assemblies. Each board, due to its unique defects, requires manual intervention at the automated placement tool to leave off the affected BGAs. It then requires additional steps to site dress, place and reflow the BGA. This operation adds significantly to the cost and cycle time of the assembly.

SUMMARY OF INVENTION

The present invention addresses prior art problems discussed above. More particularly, the present invention relates to repairing two sided component surface mount carriers as well as single sided board assemblies. According to the present invention, an electrically conductive element is bonded in a deleted (e.g. drilled out) via with a head portion of the electrically conductive element connected to at least one circuit feature on the bottom of the board and the other end of the electrically conductive element electrically connected to a BGA pad or surface trace.

The present invention relates to a structure comprising:
  a circuitized laminate with electrical nets having plated through holes;
  a top side having circuitized features and a bottom side having circuitized features;
  at least one through hole without plating and having insulation along the sidewalls of the through hole;
  an electrically conductive element located in the through hole.

The electrically conductive element has a diameter that is less than the inside diameter of the deleted insulated plated through hole such that it slips freely in the deleted insulated plated through hole. The electrically conductive element also has a head, which contacts the bottom side of the laminate. A discrete wire can be attached to the electrically conductive element head. The other end of the electrically conductive element matches the laminated thickness and is electrically connected to circuitized features on the top side of the laminate.

The present invention also relates to a method of replacing an electrical net in a circuitized laminate structure. In particular, the method comprises providing a structure comprising:
  a circuitized laminate with electrical nets having plated through holes;

a top side having circuitized features and a bottom side having circuitized features;

locating a through hole electrically connected to an electrical net;

removing plating in said through hole;

providing an electrically conductive element having a first section of a length which matches or exceeds the laminate thickness and of smaller diameter than the through hole, and a second headed section of greater diameter than the through hole;

feeding the first section of the electrically conductive element through the through hole until the head contacts the bottom side of said laminate;

providing insulation in the through hole as a barrier between the through hole and electrically conductive element;

electrically connecting the electrically conductive element to said at least one circuit feature on said top side of said laminate; and connecting the headed section of the electrically conductive element to said at least one circuit feature on said bottom side of said laminate.

The present invention also relates to a structure obtained by the above process.

Still other objects and advantages of the present invention will become readily apparent by those skilled in the art from the following detailed description, wherein it is shown and described preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

BEST AND VARIOUS MODES FOR CARRYING OUT INVENTION

Reference will be made to the figures to facilitate an understanding of the present invention.

Figure 1:
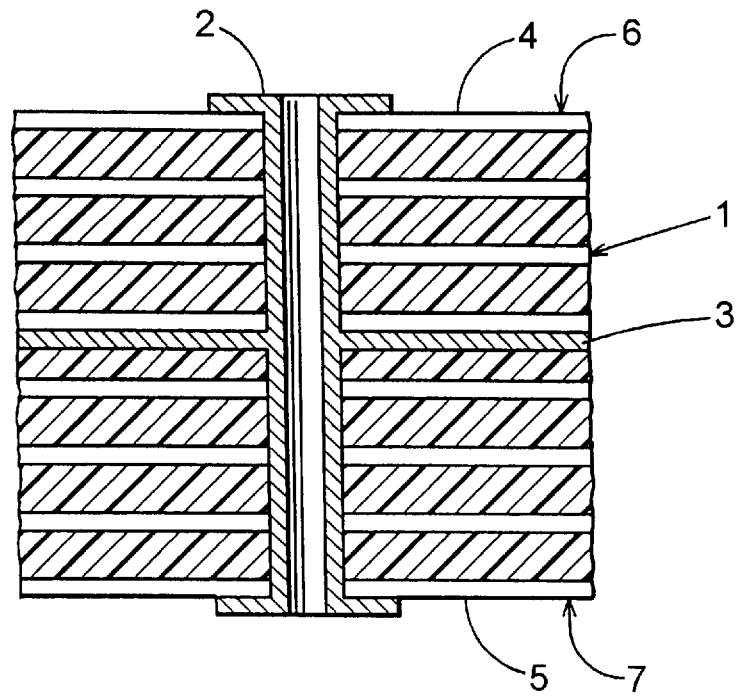
FIG. 1 is a schematic diagram of a structure during the initial states of the method of the present invention.
Figure 2:
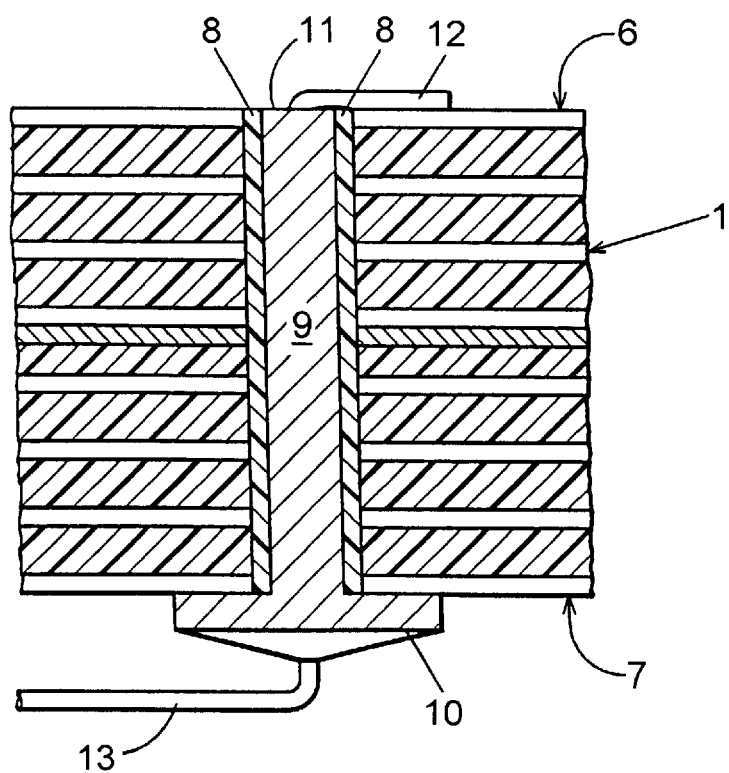
FIG. 2 is a schematic diagram of structure employing the present invention.

In particular, FIG. 1 illustrates a circuitized laminate 1 with electrical nets having plated through holes. Circuitized features 4 and 5 are present on a top side 6 and a bottom side 7 respectively of the laminate 1. A defective electrical net 3 located at a plated through hole 2.

Plating that existed in the electrical net 3 has been removed such as by drilling. After this, an insulating material 8 such as a curable composition, an example being an epoxy composition, is placed in the deleted plated through hole. In the event, the insulating material is curable, it can then be cured such as by heating. A particular epoxy employed was Hysol AP 2001 which can be cured at temperatures of about 85° C. for about one hour.

Next, a hole of smaller diameter can be concentrically formed in the insulating material, such as by drilling. The drilling can be carried out by mechanical or laser drilling. This leaves a layer of insulating material remaining along the sidewall of the deleted plated through hole.

An electrically conductive element 9 such as a metal wire or pin, a specific example being a copper pin, is secured in the hole and is located such that the headed end 10 of the element 9 is held against the bottom side of the board 7 and preferably flush with the bottom side of the board. The end 11 of the element 9 that is protruding through the topside of the deleted can be trimmed flush to the board surface. This can be done by clipping and then deburring/flattening the end with sandpaper or a dressing stone. A flat wire 12 such as a copper ribbon can then be attached between the machined end of the element 9 and the BGA pad or surface trace/dogbone running to the pad with a welding operation.

This procedure is done at both ends of the electrical net 3. A discrete wire 13 is then attached such as being soldered to the head 10 of the element 9 at each end of the net to reestablish the electrical connection.

The insulation 8 between the through hole and electrically conductive element can be provided by techniques other than that disclosed above, if desired. For example, the first section of the electrically conductive element 9 can be precoated with insulation layer prior to positioning the electrically conductive replacement element 9 in the through hole. The diameter of the precoated electrically conductive element 9 can be selected so that it can be inserted in the through hole 2 and held therein in the nature of a forced fit. In another technique, a hollow insulation sleeve could be provided in the through hole and the electrically conductive element 9 then positioned within the sleeve. Moreover, any combination of these procedures can be employed.

The present invention solves the problem of automated assembly by allowing a defective board (one with deleted nets) to be built through two sided SMT assembly just like any other board (one with no defects) and then have the discrete wires added at the end of the process to replace the deleted nets.

The present invention eliminates handling damage due to a protruding pin. Due to its small size and delicate nature, the current practice using a protruding pin on the bottom surface is subject to damage during processing and handling. Because the electrically conductive replacement element e.g. pin can be flush according to the present invention, there is no portion to bend or damage. This additionally eliminates all the special fixturing, boxes, and covers used to protect a protruding pin.

Moreover, the present invention allows for BGA auto placement. Because of the interconnection made between the BGA pad and the copper pin, the BGA can be placed during normal topside assembly. Upon reflow, the connection is completed from the BGA ball, through the pad and welded copper ribbon and into the copper pin. This allows the attachment process to be concurrent and identical to the other BGAs on a board.

In addition, the present invention allows for general net replacement and specifically for defective net replacement at the end of the process. The defective net is replaced as the last step in the assembly process by surface soldering a wire from the bottom side head of the electrically conductive element e.g. pin on one end of the deleted net to a corresponding connection (another deleted via and copper pin, SMT pad, existing via, SMT device lead, or through the hole lead) at the other end of the net. This eliminates the chance of damage to the wire during the assembly operations. Furthermore, the present invention allows for in circuit testing to check the integrity of the replaced net. The head of the electrically conductive element provides a favorable contact surface for the probes of the in-circuit tester.

The welded connection at the BGA pad/trace and pin provides a high reliability metallurgical connection that is not subject to reflow during the initial BGA attachment or subsequent rework like a soldered connection.

Furthermore, the present invention eliminates potential shorting of adjacent BGA balls to the rework wire in the current method of running through the ball array. Also, the present invention allows for repair of a damaged wire without the need to remove the BGA.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A circuitized laminate with electrical nets having plated through holes comprising:

a laminate having a top side with circuitized features and a bottom side with circuitized features;

at least one through hole having a wall without plating in said laminate;

an electrically conductive element located in said at least one through hole having a wall without plating, said electrically conductive element having a first end section of a length equal to or greater than the length of said at least one through hole having a wall without plating, and of a diameter smaller than the diameter of said at least one through hole having a wall without plating, a second headed section of a diameter greater than the diameter of said through hole having a wall without plating, contacting said bottom side of said laminate, and said first end section of said electrically conductive element is electrically connected to one of said circuitized features on said top side of said laminate, and said second headed section of said electrically conductive element connected to one of said circuitized features on said bottom side of said laminate; and, an insulation barrier located between said electrically conductive element and said wall without plating of said at least one through hole.

2. The circuitized laminate of claim 1 wherein said laminate is a two sided component surface carrier having ball grid array and surface mounted technology connections.

3. The circuitized laminate of claim 2 further comprising ball grid array pads on said top side; and surface mount technology on said bottom side.

4. The circuitized laminate of claim 1 being a subcomposite.

5. The circuitized laminate of claim 1 wherein said electrically conductive element is a copper wire.

6. The circuitized laminate of claim 1 which further comprises a flat wire having one end welded to said first end section of said electrically conductive element and a second end welded to one of the circuitized features on said top side of said laminate.

7. The circuitized laminate of claim 1 wherein said insulation barrier is a cured epoxy resin.

8. The circuitized laminate of claim 1 wherein said second headed section of said electrically conductive element is located substantially flush with said bottom side of said laminate.

9. The circuitized laminate of claim 1 wherein said first end section of said electrically conductive element is located flush with said top side of said laminate.

* * * * *